(12) United States Patent
Tanaka

(10) Patent No.: US 7,327,916 B2
(45) Date of Patent: Feb. 5, 2008

(54) BEAM HOMOGENIZER, LASER IRRADIATION APPARATUS, AND METHOD OF MANUFACTURING A SEMICONDUCTOR DEVICE

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 112 days.

(21) Appl. No.: 10/793,786

(22) Filed: Mar. 8, 2004

(65) Prior Publication Data

US 2004/0179807 A1  Sep. 16, 2004

(30) Foreign Application Priority Data

Mar. 11, 2003 (JP) ............................. 2003-065682

(51) Int. Cl.
*G02B 6/26* (2006.01)

(52) U.S. Cl. .................. 385/31; 359/487; 385/146; 385/34

(58) Field of Classification Search ......... 385/129–133
See application file for complete search history.

(56) References Cited

U.S. PATENT DOCUMENTS

| | | | |
|---|---|---|---|
| 4,744,615 A | 5/1988 | Fan et al. | |
| 4,793,694 A | 12/1988 | Liu | |
| 4,830,447 A * | 5/1989 | Kamiyama et al. | 385/130 |
| 5,080,474 A | 1/1992 | Miyamoto | |
| 5,224,200 A | 6/1993 | Rasmussen et al. | |
| 5,285,509 A * | 2/1994 | Reeder et al. | 385/33 |
| 5,303,084 A * | 4/1994 | Pflibsen et al. | 359/503 |
| 5,825,551 A | 10/1998 | Clarkson et al. | |
| 5,886,313 A | 3/1999 | Krause et al. | |
| 5,900,980 A | 5/1999 | Yamazaki et al. | |
| 6,002,523 A | 12/1999 | Tanaka | |
| 6,038,075 A | 3/2000 | Yamazaki et al. | |
| 6,078,652 A * | 6/2000 | Barak | 379/114.02 |
| 6,104,535 A | 8/2000 | Tanaka | |
| 6,137,633 A | 10/2000 | Tanaka | |

(Continued)

FOREIGN PATENT DOCUMENTS

EP   1 063 049   12/2000

(Continued)

OTHER PUBLICATIONS

European Search Report dated Feb. 18, 2005 for Application No. 04005845.5.

(Continued)

*Primary Examiner*—Frank G. Font
*Assistant Examiner*—Eric Wong
(74) *Attorney, Agent, or Firm*—Eric J. Robinson; Robinson Intellectual Property Law Office, P.C.

(57) ABSTRACT

The present invention provides a beam homogenizer being equipped with an optical waveguide having a pair of reflection planes provided oppositely, having one end surface into which the laser beam is incident, and having the other end surface from which the laser beam is emitted in the optical system for forming the beam spot. The optical waveguide is a circuit being able to keep radiation light in a certain region and to transmit the radiation light in such a way that the energy flow thereof is guided in parallel with an axis of the channel.

53 Claims, 9 Drawing Sheets

U.S. PATENT DOCUMENTS

| | | | |
|---|---|---|---|
| 6,157,492 A | 12/2000 | Yamazaki et al. | |
| 6,176,926 B1 | 1/2001 | Tanaka | |
| 6,212,012 B1 | 4/2001 | Tanaka | |
| 6,215,595 B1 | 4/2001 | Yamazaki et al. | |
| 6,239,913 B1 | 5/2001 | Tanaka | |
| 6,291,320 B1 | 9/2001 | Yamazaki et al. | |
| 6,304,385 B1 | 10/2001 | Tanaka | |
| 6,310,727 B1 | 10/2001 | Tanaka | |
| 6,388,812 B2 | 5/2002 | Yamazaki et al. | |
| 6,393,042 B1 | 5/2002 | Tanaka | |
| 6,437,284 B1 | 8/2002 | Okamoto et al. | |
| 6,437,313 B2 | 8/2002 | Yamazaki et al. | |
| 6,441,965 B2 | 8/2002 | Yamazaki et al. | |
| 6,563,843 B1 | 5/2003 | Tanaka | |
| 6,573,162 B2 | 6/2003 | Tanaka et al. | |
| 6,693,257 B1 | 2/2004 | Tanaka | |
| 6,738,396 B2 * | 5/2004 | Filgas et al. | 372/19 |
| 6,785,304 B2 * | 8/2004 | Filgas | 372/19 |
| 6,856,727 B2 * | 2/2005 | Li | 385/31 |
| 7,169,630 B2 * | 1/2007 | Moriwaka | 438/22 |
| 2001/0010702 A1 | 8/2001 | Tanaka | |
| 2002/0003666 A1 | 1/2002 | Yamazaki et al. | |
| 2002/0146873 A1 | 10/2002 | Tanaka | |
| 2002/0196551 A1 | 12/2002 | Yamazaki et al. | |
| 2003/0061984 A1 | 4/2003 | Maekawa et al. | |
| 2003/0068836 A1 | 4/2003 | Hongo et al. | |
| 2003/0203549 A1 | 10/2003 | Yamazaki et al. | |
| 2004/0058553 A1 | 3/2004 | Tanaka | |
| 2004/0213514 A1 | 10/2004 | Tanaka | |
| 2005/0031261 A1 | 2/2005 | Tanaka | |
| 2005/0079645 A1 | 4/2005 | Moriwaka | |

FOREIGN PATENT DOCUMENTS

| | | |
|---|---|---|
| EP | 1 122 020 | 8/2001 |
| GB | 2 044 948 | 10/1980 |
| JP | 08-338962 | 12/1996 |
| JP | 09-234579 | 9/1997 |
| JP | 2001-291681 | 10/2001 |
| JP | 2002-184206 | 6/2002 |

OTHER PUBLICATIONS

European Search Report dated Jan. 26, 2004 for Application No. 03021233.

* cited by examiner

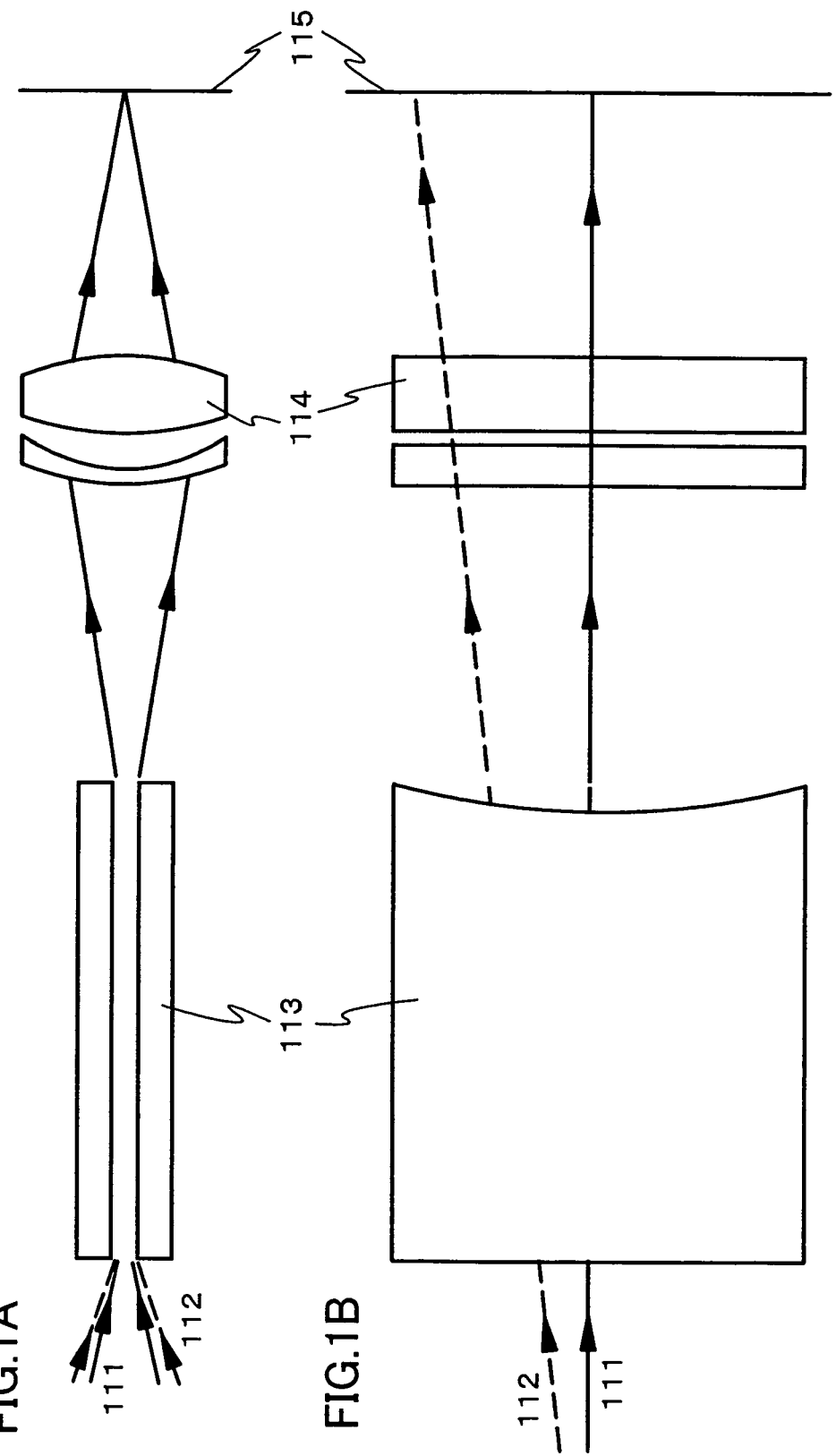

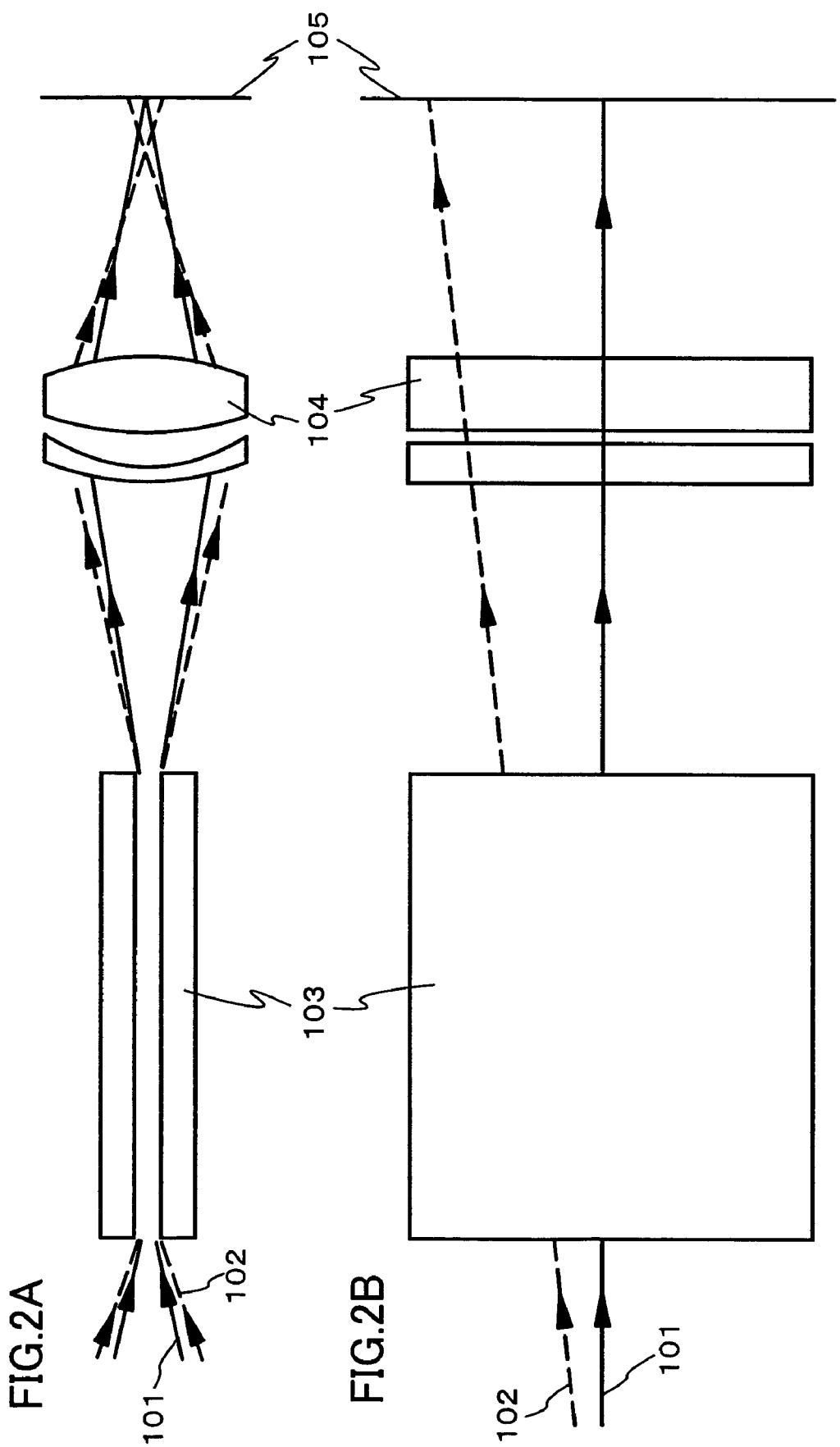

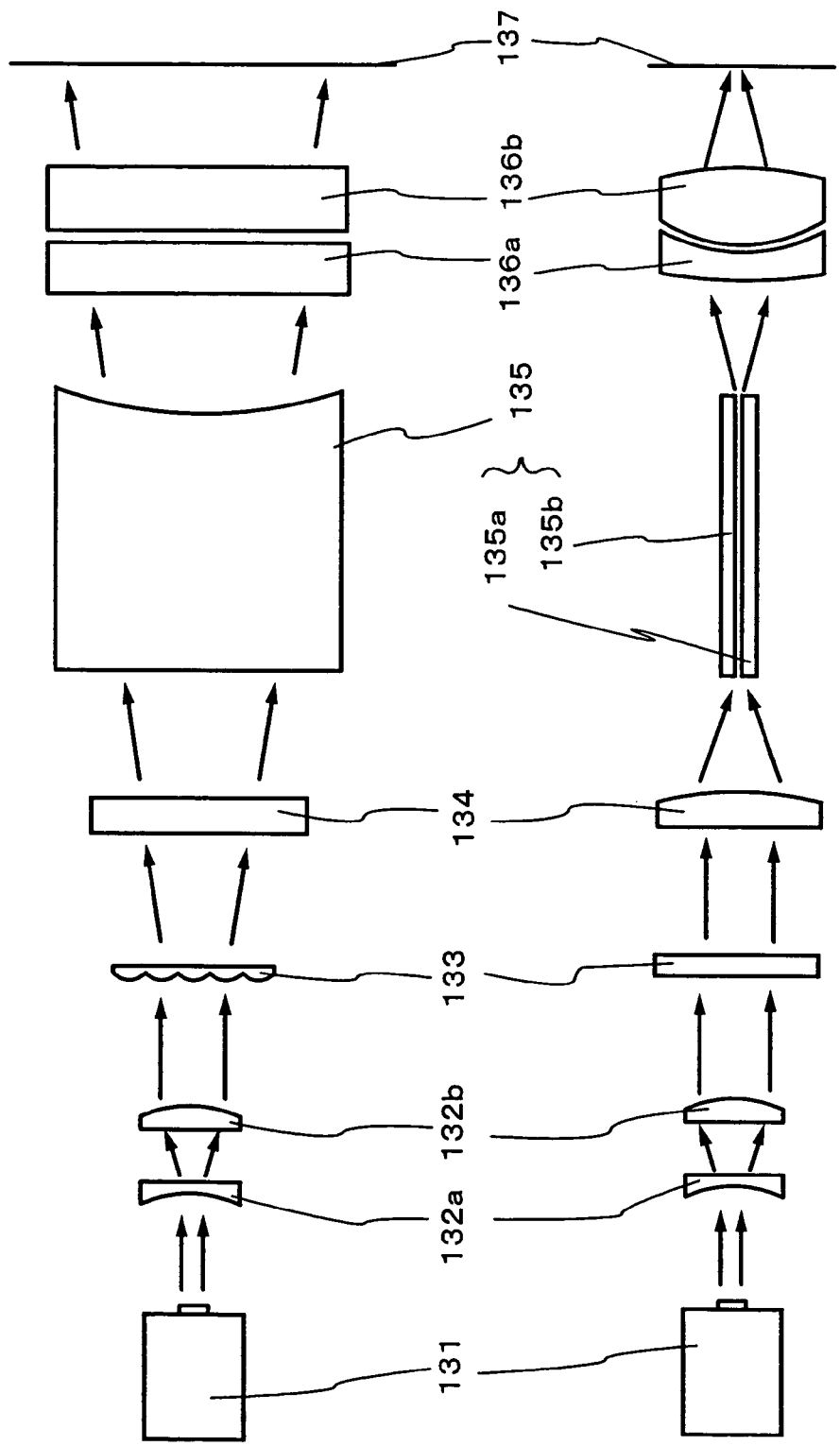

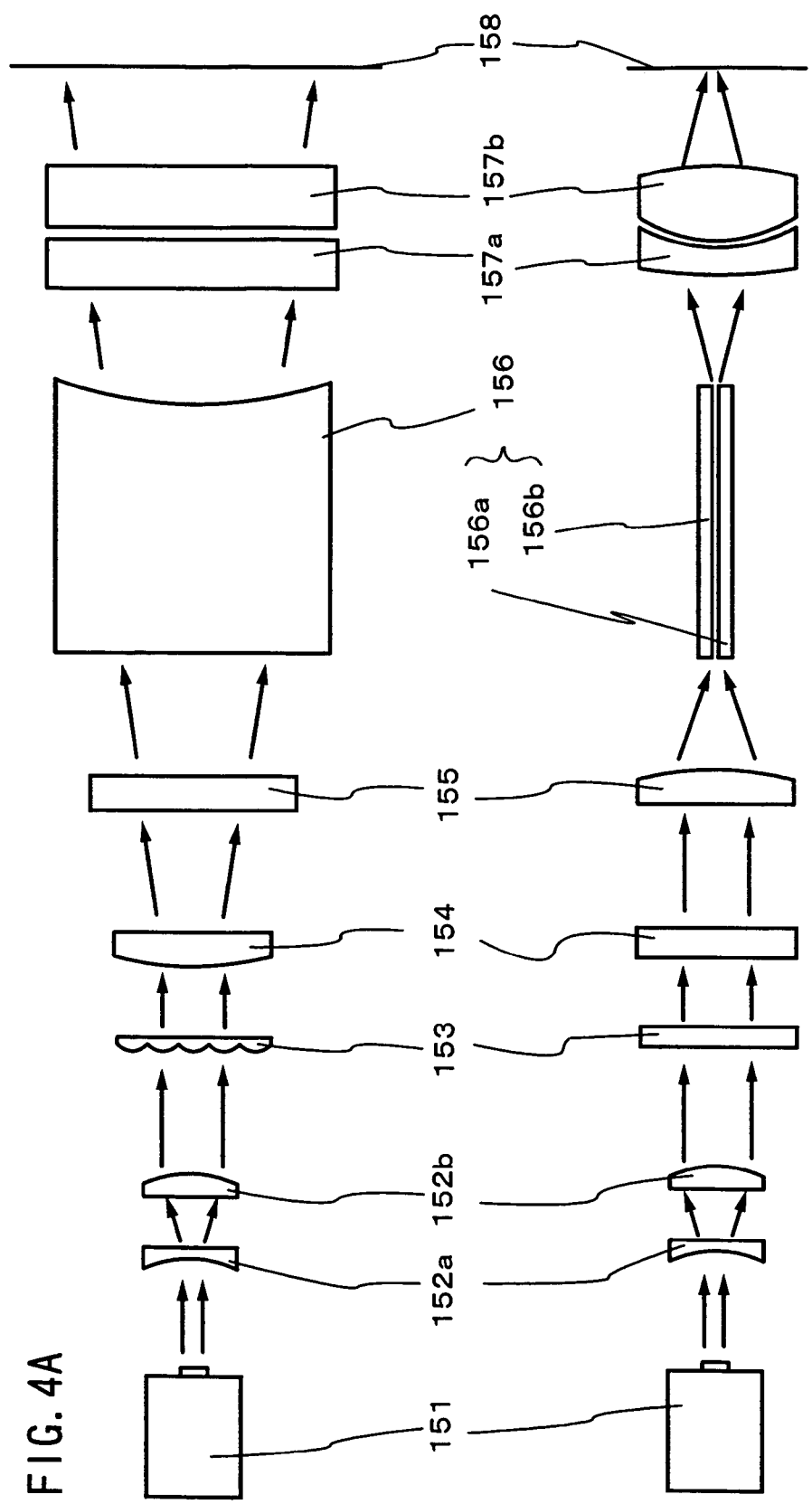

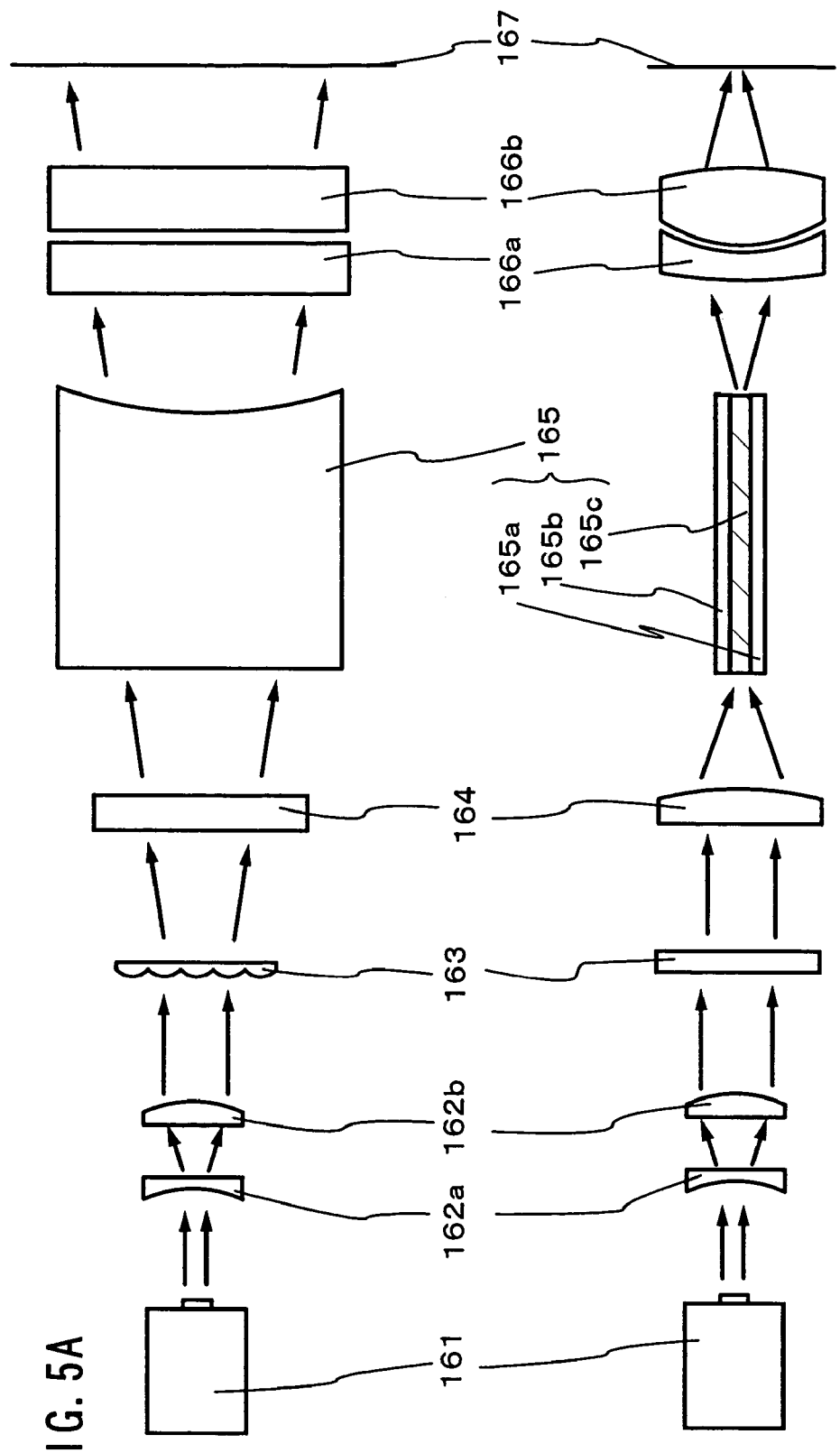

BEAM HOMOGENIZER, LASER IRRADIATION APPARATUS, AND METHOD OF MANUFACTURING A SEMICONDUCTOR DEVICE

BACKGROUND OF THE INVENTION

1. Field of the Invention

The present invention relates to a beam homogenizer to homogenize energy distribution of a beam spot on a surface to be irradiated in a certain region. The present invention also relates to a laser irradiation apparatus to irradiate the beam spot to the surface to be irradiated, and to a method for manufacturing a semiconductor device using the laser irradiation apparatus.

2. Description of the Related Art

In recent years, the research has been conducted widely concerning the technique to perform laser annealing to an amorphous semiconductor film or a crystalline semiconductor film (a semiconductor film having a crystallinity such as poly-crystal or micro-crystal, which is not single-crystal) formed over an insulating substrate such as a glass substrate. A silicon film is often used as the semiconductor film. It is noted that the laser annealing described here indicates a technique to recrystallize a damaged layer or an amorphous layer formed over a semiconductor substrate or over the semiconductor film on a substrate, a technique to crystallize the amorphous semiconductor film formed over the substrate, and also includes a technique applied to planarize or modify a surface of the semiconductor substrate or the semiconductor film on a substrate.

The glass substrate is inexpensive and is easily processed into a large substrate compared with a quartz substrate which has been often used conventionally. This is the reason why the research has been conducted extensively. A laser beam is commonly employed in crystallization since the glass substrate has low melting point. The laser beam can give high energy only to the non-single crystal semiconductor film without changing the temperature of the substrate that much.

A crystalline silicon film formed by performing the laser annealing has high mobility. Therefore, a thin film transistor (TFT) using this crystalline silicon film is extensively utilized. For example, the TFT is utilized in a liquid crystal electro-optic device, a light-emitting device and the like of monolithic type in which the TFT for a pixel and the TFT for a driver circuit are manufactured on one glass substrate. The crystalline silicon film is formed of a number of crystal grains and thereby it is referred to as a poly-crystalline silicon film or a poly-crystalline semiconductor film.

In the laser annealing process, a pulsed laser beam generated from an excimer laser is shaped into a square spot with several centimeters on a side or into a rectangular spot having a longer side of 10 cm or more at a surface to be irradiated through an optical system and the beam spot is moved relatively to the surface to be irradiated. Since such a method can enhance productivity and is superior industrially, it is preferably employed. It is noted that among the rectangular beam spots, a rectangular beam spot having a particularly high aspect ratio is referred to as a linear beam spot in this specification.

In particular, unlike a punctate beam spot requiring to be scanned from front to back and from side to side, the linear beam spot can provide high productivity since the linear beam spot can be irradiated to the large-sized surface to be irradiated by scanning the linear beam spot only in one direction perpendicular to the direction of the longer width of the linear beam spot. The laser beam is scanned in the direction perpendicular to the direction of the longer width of the linear beam spot since it is the most effective way to scan the laser beam. Because of such high productivity, at present, the laser annealing process is mainly employing the linear beam spot obtained by shaping the beam spot emitted from a pulsed excimer laser through an appropriate optical system.

FIGS. 7A and 7B show an optical system to process the sectional shape of the beam spot into linear on the surface to be irradiated. The optical system shown in FIGS. 7A and 7B is an extremely general optical system. The optical system not only processes the sectional shape of the beam spot into linear, but also homogenizes the energy distribution of the beam spot on the surface to be irradiated at the same time. Usually the optical system to homogenize the energy distribution of the beam spot is called a beam homogenizer. The optical system shown in FIGS. 7A and 7B is also the beam homogenizer.

When XeCl excimer laser (wavelength: 308 nm) is used as a light source, it is preferable that all the optical elements are made of quartz in order to obtain high transmittance. In addition, it is preferable to use the coating which transmittance to the wavelength of the excimer laser becomes 99% or more. When the other excimer lasers having shorter wavelengths are used as the light source, it is possible to obtain high transmittance by using fluorite or $MgF_2$ as the material of the optical system. However, since these materials are crystal, attention must be paid in selecting the cut surface, coating and the like.

First, a side view of FIG. 7A is explained. A laser beam emitted from a laser oscillator 1201 is divided in one direction through cylindrical lens arrays 1202a and 1202b. The direction is referred to as a longitudinal direction in this specification. When a mirror is inserted in the optical system, the longitudinal direction is bent to the direction of the laser beam bent by the mirror. In this structure, the laser beam is divided into four beams. These divided beams are combined into one beam spot once with a cylindrical lens 1204. The beam spots separated again are reflected by a mirror 1207, and then are converged into one beam spot again on a surface to be irradiated 1209 through a doublet cylindrical lens 1208. The doublet cylindrical lens is a lens including two cylindrical lenses. This homogenizes the energy of the linear beam spot in the longitudinal direction and also determines the length in the longitudinal direction.

Next, a top view of FIG. 7B is explained. A laser beam emitted from the laser oscillator 1201 is divided in a direction perpendicular to the longitudinal direction through a cylindrical lens array 1203. The direction perpendicular to the longitudinal direction is referred to as a lateral direction in this specification. When a mirror is inserted in the optical system, the lateral direction is bent to the direction of the beam bent by the mirror. In this structure, the laser beam is divided into seven beams. These divided beams are combined into one beam spot with a cylindrical lens 1205 on the surface to be irradiated 1209. A dotted line shows correct optical path, correct positions of the lens and surface to be irradiated in the case not disposing the mirror 1207. This homogenizes the energy of the linear beam spot in the lateral direction and also determines the length of the lateral direction.

As described above, the cylindrical lens arrays 1202a, 1202b, and 1203 are the lenses to divide the beam spot of the laser beam. The obtained homogeneity of the energy distribution of the linear beam spot depends on the number of the divided beam spots.

Each of the lenses is made of quart in order to correspond with the XeCl excimer laser. In addition, the lenses have their surfaces coated so that the laser beam emitted from the excimer laser transmits through the lenses very much. This makes transmittance of the excimer laser beam become 99% or more per one lens.

The linear beam spot processed through the above structure is irradiated as being overlapped in such a way that the linear beam spot is displaced gradually in the direction of a minor axis of the linear beam spot. With such an irradiation performed, the laser annealing can be performed to the whole surface of the non-single crystal silicon film so as to crystallize it or to enhance its crystallinity.

Some of the beam homogenizers use a reflecting mirror. (For example, patent document: published patent application No. 2001-291681.)

At present, the long linear beam processed through the optical system as above is used to anneal the semiconductor film in a mass-production factory. When the laser annealing is performed, however, there are some problems that a position of a plane having a homogeneous beam spot changes with the frequency of the pulsed excimer laser, that the homogeneity of the beam spot on the surface to be irradiated goes worse due to the cleaning of the window to isolate the gas, which is a laser medium of the excimer laser, from the outside, and so on. Therefore, the laser irradiation apparatus is not yet of high-quality for mass production.

SUMMARY OF THE INVENTION

In view of such problems, it is an object of the present invention to suppress as much as possible the change of the energy distribution of the beam spot on the surface to be irradiated due to the maintenance or the change of the oscillating condition of the excimer laser.

In the present invention, an optical waveguide is used to homogenize the energy distribution of the beam spot on the surface to be irradiated. The optical waveguide is a circuit being able to keep radiation light in a certain region and to transmit the radiation light in such a way that the energy flow thereof is guided in parallel with an axis of the channel.

The present invention provides a beam homogenizer comprising an optical waveguide having a pair of reflection planes provided oppositely, having one end surface into which a laser beam is incident and having the other end surface from which the laser beam is emitted, wherein the other end surface is curved.

The reason why the optical waveguide has curvature in the end surface on the side where the laser beam is emitted in the present invention is explained as follows. The present inventor considered that one of the reasons to make the energy distribution inhomogeneous lies in the large divergence angle of the laser beam extended extremely widely so as to be rectangular through an optical system. That is to say, the present inventor assumed that a position of a focal point of the lens projecting the laser beam emitted from the optical waveguide differs in the center and in the opposite ends of the rectangular beam in the direction of its major axis. Therefore, the end surface of the optical waveguide where the laser beam is emitted is curved so that a ray extended long in the direction of the major axis of the rectangular beam and a ray reaching the center of the rectangular beam are focused on the same surface to be irradiated. In other words, the distance from the exit of the optical waveguide to the surface to be irradiated is made different in the opposite ends and the center of the rectangular beam spot. This makes it possible to homogenize the energy distribution since the laser beam is focused on the same surface to be irradiated in entire length in the direction of its major axis.

That is to say, the present invention provides a beam homogenizer having a curved end surface on the side where the laser beam is emitted so that when the laser beam emitted from the optical waveguide is projected through a projection lens, the center and the opposite ends of the laser beam are focused on the surface to be irradiated.

The present invention also provides a beam homogenizer comprising a light pipe instead of the optical waveguide to homogenize the energy distribution of the beam spot on the surface to be irradiated in the direction of the minor axis. The light pipe is a transparent member shaped into circular conic, pyramidal, columned or the like which transmits the light from one end to the other end by the total reflection. It is noted that the light may be transmitted through the reflection by the mirror.

The present invention provides a laser irradiation apparatus comprising a laser oscillator, a beam homogenizer, and one cylindrical lens or a plurality of cylindrical lenses to converge the laser beam emitted from the beam homogenizer on a surface to be irradiated, wherein the beam homogenizer is equipped with an optical waveguide having a pair of reflection planes provided oppositely, having one end surface into which the laser beam is incident and having the other end surface from which the laser beam is emitted, wherein the other end surface is curved.

In the above structure, the beam homogenizer has the curved end surface on the side where the laser beam is emitted so that when the laser beam emitted from the optical waveguide is projected through a projection lens, the center and the opposite ends of the laser beam are focused on the surface to be irradiated.

In the above structure, the laser oscillator is selected from the group consisting of an excimer laser, a YAG laser, a glass laser, a $YVO_4$ laser, a YLF laser, and an Ar laser.

The present invention also provides a beam homogenizer comprising a light pipe instead of the optical waveguide to homogenize the energy distribution of the beam spot on the surface to be irradiated in the direction of the minor axis.

The present invention provides a method for manufacturing a semiconductor device comprising the steps of forming an amorphous semiconductor film over a substrate, and performing laser annealing to the amorphous semiconductor film with a laser beam emitted from a laser oscillator being shaped into rectangular on a surface to be irradiated through a cylindrical lens array and a beam homogenizer while moving the position of the beam spot, assuming that the amorphous semiconductor film is the surface to be irradiated, wherein the cylindrical lens array acts upon the major axis of the rectangular beam spot, wherein the beam homogenizer acts upon the minor axis of the rectangular beam spot, wherein the laser annealing is performed to the amorphous semiconductor film with the laser beam whose energy distribution is homogenized through the beam homogenizer being equipped with an optical waveguide having a pair of reflection planes provided oppositely, having one end surface into which the laser beam incident, and having the other end surface from which the laser beam is emitted, and wherein the other end surface is curved.

In the above structure, the laser oscillator is selected from the group consisting of an excimer laser, a YAG laser, a glass laser, a $YVO_4$ laser, a YLF laser, and an Ar laser.

The present invention also provides a method for manufacturing a semiconductor device with a light pipe employed in the beam homogenizer instead of the optical waveguide to homogenize the energy distribution of the beam spot on the surface to be irradiated in the direction of the minor axis.

When the beam homogenizer to form the rectangular beam spot using the optical waveguide disclosed in the present invention is employed, it is possible to form the rectangular beam spot having homogeneous energy distribution in the directions of its minor axis and its major axis on the surface to be irradiated. In addition, since the position and the energy distribution of the beam spot formed on the surface to be irradiated are not easily affected by the oscillating condition of the laser oscillator, it becomes possible to enhance the stability of the laser beam.

When the rectangular beam spot emitted from the laser irradiation apparatus including the optical system disclosed in the present invention is scanned on the semiconductor film in the direction of the minor axis of the rectangular beam, it is possible to prevent the crystallinity from being inhomogeneous due to the inhomogeneity of the energy distribution of the beam spot so that the homogeneity of the crystallinity over the surface of the substrate can be enhanced. Moreover, the present invention has the advantages that the high stability of the laser irradiation apparatus can be secured, and the running cost can be decreased because of the improvement of the maintenance characteristic. When the present invention is applied to the mass production of the low-temperature poly-crystalline silicon TFT, it is possible to produce the TFT with high operating characteristic effectively.

BRIEF DESCRIPTION OF THE DRAWINGS

In the accompanying drawings:

FIGS. 1A and 1B are drawings to explain the means to solve the problem according to the present invention;

FIGS. 2A and 2B are drawings to explain the problem to be solved according to the present invention;

FIGS. 3A and 3B are drawings to show an example of the laser irradiation apparatus according to the present invention;

FIGS. 4A and 4B are drawings to show an example of the laser irradiation apparatus according to the present invention;

FIGS. 5A and 5B are drawings to show an example of the laser irradiation apparatus according to the present invention.

DETAILED DESCRIPTION OF THE INVENTION

Embodiment Mode

Figure 6A:
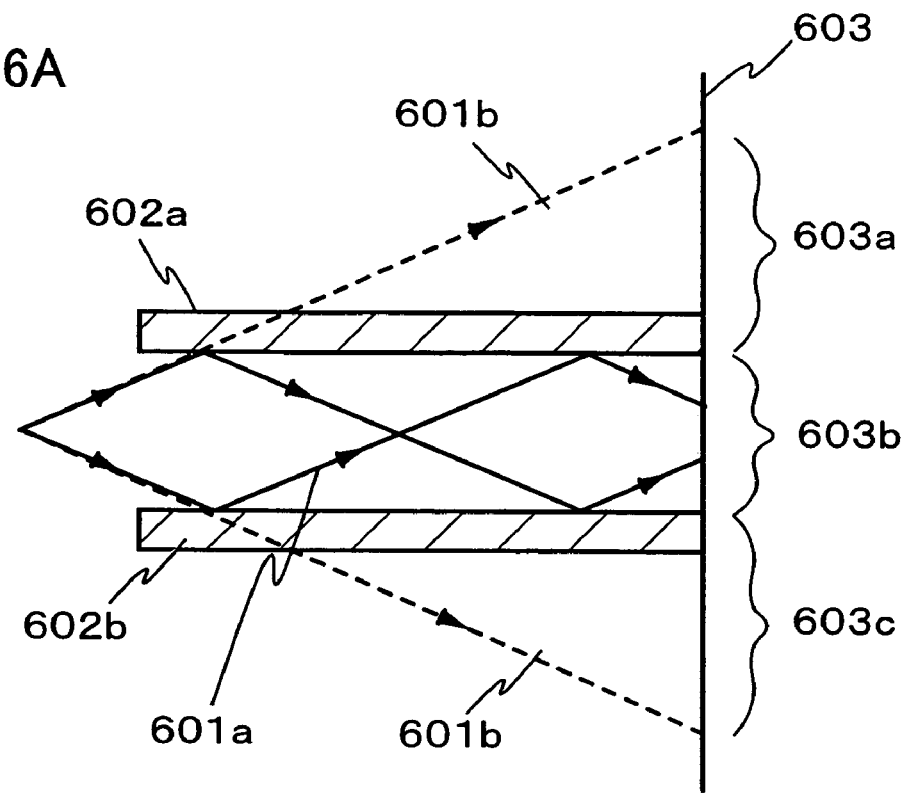
FIGS. 6A and 6B are drawings to show an example to homogenize the energy distribution by the optical waveguide according to the present invention.
Figure 6B:
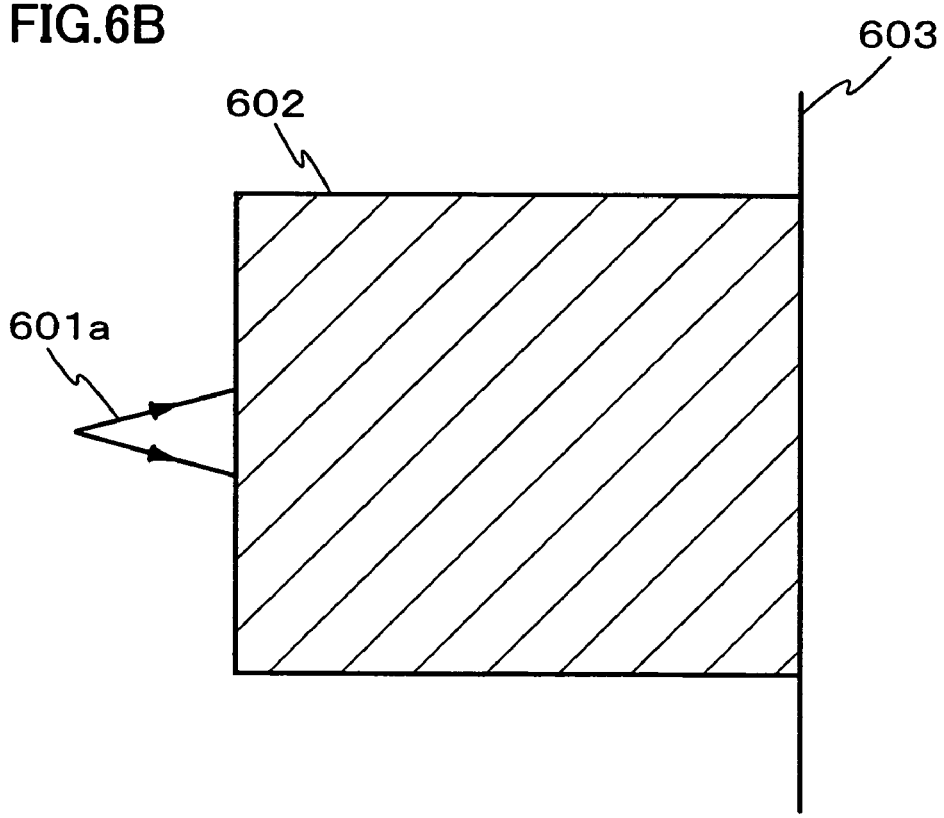
Figure 7A:
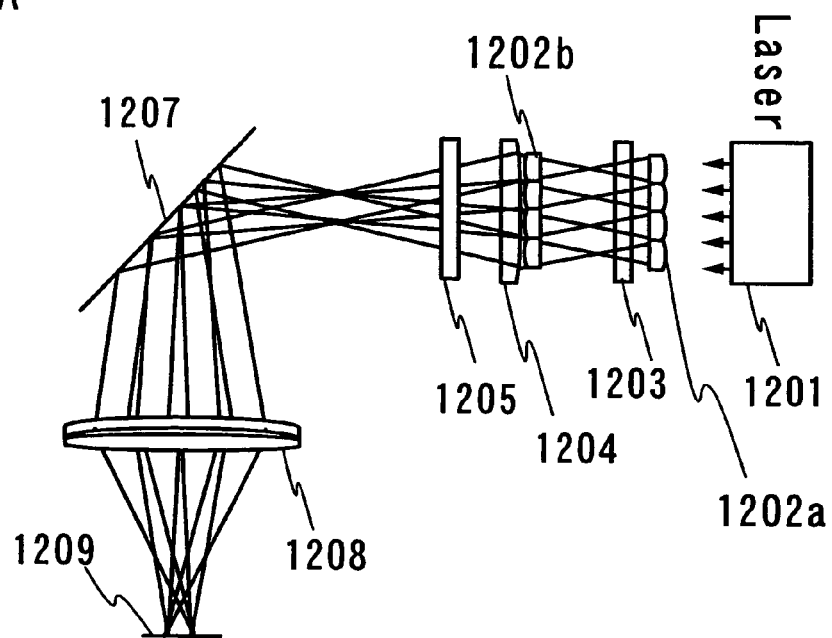
FIGS. 7A and 7B are drawing to show a prior art.
Figure 7B:
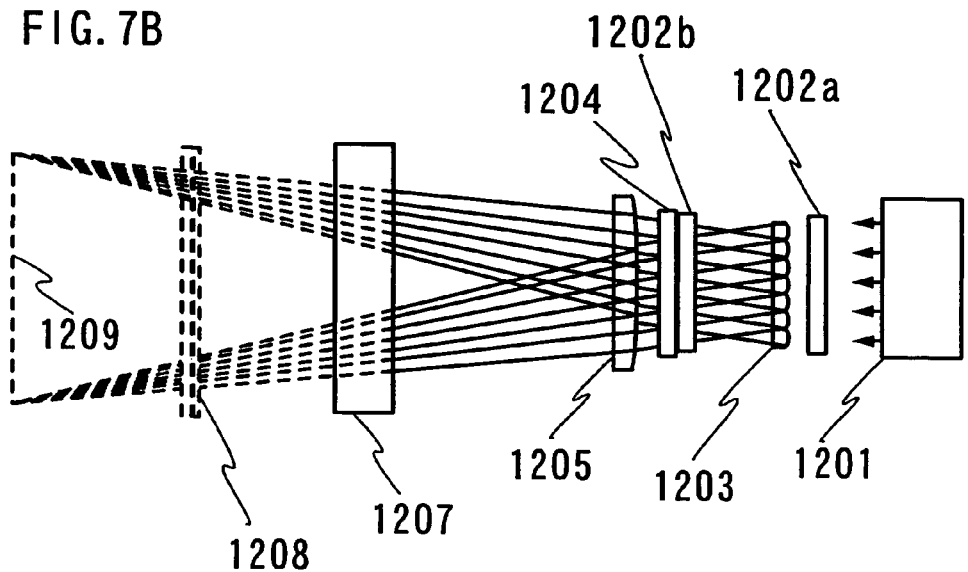

Initially, the way to homogenize the energy distribution of the beam spot by the optical waveguide is explained with FIGS. 6A and 6B. A side view of FIG. 6A is explained first. An optical waveguide 602 having a pair of reflection planes 602a and 602b provided oppositely and a surface to be irradiated 603 are prepared. Then the ray is made incident from the left side on the paper. The ray is drawn with a full line 601a when there is the optical waveguide 602, and drawn with a dotted line 601b when there is not the optical waveguide 602. When there is not the optical waveguide 602, the ray being incident from the left side on the paper reaches regions 603a, 603b, and 603c in the surface to be irradiated 603 as shown with the dotted line 601b.

On the other hand, when there is the optical waveguide 602, the ray is reflected by the reflection planes of the optical waveguide 602 as shown with the ray 601a, and then all the rays reach a region 603b in the surface to be irradiated 603. That is to say, when there is the optical waveguide 602, all the rays that reach the regions 603a and 603c when there is not the optical waveguide 602, reach the region 603b in the surface to be irradiated 603. Therefore, when the rays are made incident into the optical waveguide 602, the rays are reflected repeatedly and are led to the exit. That is to say, the rays are overlapped as if the incident rays are folded on the region 603b in the surface to be irradiated 603, which is in the same position as the exit of the optical waveguide 602. In this example, the total divergence of the rays 603a, 603b, and 603c on the surface to be irradiated 603 when there is not the optical waveguide is defined as A, and the divergence of the ray 603b on the surface to be irradiated 603 when there is the optical waveguide is defined as B. Then, A/B corresponds to the number of rays divided by the homogenizer. Thus, when the incident ray is divided and all the divided rays are overlapped on the same position, the energy distribution of the ray is homogenized on the overlapped position.

Usually, the more the homogenizer divides the ray, the more homogeneous the energy distribution becomes on the position where the divided rays are overlapped. The number of the rays divided by the optical waveguide 602 can be increased when the ray is reflected more times in the optical waveguide 602. In other words, the length of the pair of reflection planes in the direction where the rays are incident may be made longer. Moreover, the number of divided rays can be increased by narrowing the space between the reflection planes provided oppositely, or by enhancing NA (numerical aperture) of the ray which is incident into the optical waveguide.

The optical system disclosed in the present invention to form the rectangular beam spot is explained with FIGS. 3A and 3B. First, a side view of FIG. 3B is explained. A laser beam emitted from a laser oscillator 131 is propagated to the direction shown with an arrow in FIGS. 3A and 3B. First, the laser beam is expanded through spherical lenses 132a and 132b. Such a structure is not necessary when the laser oscillator 131 generates a sufficiently large beam spot.

The beam spot of the laser beam is narrowed in the direction of a minor axis of the rectangular beam through a cylindrical lens 134, and is incident into an optical waveguide 135 having a pair of reflection planes 135a and 135b provided oppositely behind the cylindrical lens 134. A plane having a homogeneous energy distribution in the direction of the minor axis of the rectangular beam spot is formed on the exit surface of the optical waveguide 135.

The longer the length of the optical waveguide 135 in the direction where the beam is incident is, or the shorter the focal length of the cylindrical lens 134 is, the more homogeneous the energy distribution becomes. However, the actual system must be manufactured in consideration of the size of the optical system, and thereby the length of the optical waveguide and the focal length of the cylindrical lens must be practical in accordance with the size of the system.

In FIGS. 3A and 3B, a doublet cylindrical lens 136 disposed behind the optical waveguide 135 projects the homogeneous plane formed right after the optical waveguide 135 to the surface to be irradiated positioned behind the doublet cylindrical lens 136. The doublet cylindrical lens is a lens including two cylindrical lenses 136a and 136b. This makes it possible to project the homogeneous plane formed on the exit surface of the optical waveguide 135 to another surface (the surface to be irradiated). That is to say, the homogeneous plane and the surface to be irradiated 137 are conjugated with respect to the doublet cylindrical lens 136. The optical waveguide 135 and the doublet cylindrical lens 136 homogenize the energy distribution of the rectangular beam spot in the direction of its minor axis, and determine the length of the minor axis. It is noted that when the homogeneity of the beam spot on the surface to be irradiated is not required that much, or when F-number of the doublet cylindrical lens is extremely high, a singlet cylindrical lens may be employed.

Next, a top view of FIG. 3A is explained. The laser beam emitted from the laser oscillator 131 is divided in the direction of the major axis of the rectangular beam through a cylindrical lens array 133. The cylindrical lens array 133 has cylindrical lenses arranged in the direction of the curvature thereof. This embodiment employs a cylindrical lens array having five cylindrical lenses arranged. This homogenizes the energy distribution of the rectangular beam spot in the direction of its major axis and determines the length thereof in the direction of its major axis. It is noted that the cylindrical lens for combining the laser beams divided by the cylindrical lens array may be disposed behind the cylindrical lens array.

The laser beam emitted from the cylindrical lens array 133 is incident into the optical waveguide 135 disposed behind the cylindrical lens array 133. The optical waveguide 135 comprises a pair of reflection planes 135a and 135b, each of which has curvature in the end surface on the side where the laser beam is emitted. FIGS. 1A to 2B explain the reason why the optical waveguide 135 has curvature in the end surface on the side where the laser beam is emitted. In FIGS. 2A and 2B, a ray 101 shown with a full line is the ray forming the center of the rectangular beam. A ray 102 shown with a dotted line is the ray forming the opposite ends of the rectangular beam spot in the direction of its major axis. The rays emitted from the optical waveguide 103 having a pair of reflection planes provided oppositely form a rectangular beam on a surface to be irradiated 105 through a projection lens 104. The ray 101 is focused on the surface to be irradiated 105, while the ray 102 is focused before the surface to be irradiated 105.

On the other hand, FIGS. 1A and 1B show the same structure as that in FIGS. 2A and 2B except for the shape of the optical waveguide 113. In FIGS. 1A and 1B, the optical waveguide 113 has a curved end surface on the side where the rays are emitted so that the ray 112 extended long in the direction of the major axis of the rectangular beam and the ray 111 reaching the center of the rectangular beam spot are focused on the same surface to be irradiated. The curved end surface is cylindrical in shape and has curvature only in the direction of the major axis of the rectangular beam.

With the structure shown in FIGS. 1A and 1B, the position where the rays are emitted from the optical waveguide 113 having a pair of reflection planes provided oppositely can be made different in the center and in the opposite ends in the direction of the major axis of the rectangular beam. This makes it possible to conform the focal point in the center and in the opposite ends in the direction of the major axis of the rectangular beam on the surface to be irradiated 115 through a projection lens 114. Therefore, it is possible to form the rectangular beam spot having homogeneous energy distribution in the entire length in the direction of the major axis.

The optical waveguide has the advantage that the position of the homogeneous plane is fixed more completely by an optical system. That is to say, since the homogeneous plane is formed on the exit surface of the optical waveguide, the position of the homogeneous plane does not change at all even though the characteristic of the laser beam emitted from the laser oscillator changes in every pulse or by the maintenance and so on. That is to say, the characteristic of the laser beam is not easily affected by the pointing stability. This makes it possible to obtain a homogeneous laser beam which is not affected by the change of the condition of the laser oscillator.

It is preferable that the laser oscillator combined with the beam homogenizer of the present invention has high output and has wavelengths sufficiently absorbed in the semiconductor film. When a silicon film is employed as the semiconductor film, it is preferable to employ a laser oscillator generating a laser beam having a wavelength not longer than 600 nm in consideration of the absorption ratio. As such a laser oscillator, an excimer laser, a YAG laser (harmonic), and a glass laser (harmonic) are given.

It is noted that a $YVO_4$ laser (harmonic), a YLF laser (harmonic) and an Ar laser may be also employed as the laser oscillator generating a wavelength appropriate for crystallizing the silicon film even though the high output is not obtained yet in the current technology.

Hereinafter, a method for manufacturing a semiconductor device employing the beam homogenizer and the laser irradiation apparatus of the present invention is explained. First, a glass substrate is prepared as the substrate. The glass substrate which has enough resistance against the heat up to 600° C. is used as this glass substrate. A silicon oxide film is formed in 200 nm thick over the glass substrate as a base film. In addition, an amorphous silicon film is formed thereon. These films are formed with the sputtering. Alternatively, these films may be formed with the plasma CVD.

Next, a heating process is performed to the substrate with these films formed thereon in the atmosphere of nitrogen. This process is to decrease the concentration of hydrogen in the amorphous silicon film. This process is performed since the film cannot resist against the laser energy when the film contains too much hydrogen. The concentration of hydrogen in the film is appropriate on the order of $10^{20}$ atoms/cm$^3$. Here, $10^{20}$ atoms/cm$^3$ means that $10^{20}$ hydrogen atoms exist in 1 cm$^3$.

This embodiment mode employs a XeCl excimer laser as the laser oscillator. The excimer laser (wavelength is 308 nm) is a pulsed laser. When the energy of the pulsed laser beam fluctuates within ±5%, preferably within ±2%, in each pulse during the laser processing performed to one substrate, it is possible to perform homogeneous crystallization.

The fluctuation of the laser energy described above is defined as follows. That is to say, the average value of the laser energy in the period of the irradiation to one substrate is assumed to be standard. Then, the fluctuation of the laser energy is defined as the value expressing the difference between the average value and the minimum value in the period of the irradiation or the difference between the average value and the maximum value in the period of the irradiation in percentage terms.

The laser beam is irradiated in such a way that a stage with the surface to be irradiated 137 shown in FIGS. 3A and 3B mounted thereon is scanned in the direction of the minor axis of the rectangular beam. On this occasion, a practitioner may determine the energy density of the beam spot on the surface to be irradiated and the scanning speed appropriately. The energy density is appropriate between 200 mJ/cm$^2$ and 1000 mJ/cm$^2$. It is feasible to perform laser annealing homogeneously when the scanning speed is selected in the range where the width of the rectangular beam spot in its minor axis is overlapped one another for about 90% or more. The optimum scanning speed depends on the frequency of the laser oscillator and it may be regarded to be proportional to the frequency thereof.

Thus, the laser annealing process is completed. When such an operation is performed repeatedly, many substrates can be processed. Thus processed substrate can be utilized to manufacture an active matrix liquid crystal display, an organic EL display using an organic EL element as its light-emitting element and the like according to the known method.

The above example used the excimer laser as the laser oscillator. Since the excimer laser has very short coherent length, which is several micrometers, it is suitable for the above optical system. Although some of the lasers shown below have long coherent length, the laser whose coherent length is changed deliberately can be employed. It is also preferable to use the harmonic of the YAG laser or the harmonic of the glass laser, because output as high as that of the excimer laser can be obtained and the energy of the laser beam is sufficiently absorbed in the silicon film. As the laser oscillator appropriate for the crystallization of the silicon film, the YVO$_4$ laser (harmonic), the YLF laser (harmonic), the Ar laser and the like are given. The wavelengths of these laser beams are sufficiently absorbed in the silicon film.

The above example used the amorphous silicon film as the non-single crystal semiconductor film. However, it is easily supposed that the present invention can be applied to the other non-single crystal semiconductor films. For example, a compound semiconductor film having an amorphous structure such as an amorphous silicon germanium film may be employed as the non-single crystal semiconductor film.

Embodiment

Comparative Example

This comparative example shows a typical method for manufacturing a semiconductor film which becomes an object to be irradiated by the laser beam. First, a substrate of Corning 1737 having a thickness of 0.7 mm and a side of 127 mm was prepared. A SiO$_2$ film (silicon oxide film) was formed in 200 nm thick over the substrate with a plasma CVD apparatus, and then an amorphous silicon film (hereinafter referred to as a-Si film) was formed in 50 nm thick over the SiO$_2$ film. The substrate was exposed in the atmosphere of nitrogen at a temperature of 500° C. for an hour in order to decrease the concentration of hydrogen in the film. The concentration of hydrogen is appropriate on the order of $10^{20}$ atoms/cm$^3$. Here, $10^{20}$ atoms/cm$^3$ means that $10^{20}$ hydrogen atoms exist in 1 cm$^3$. This increased the resistance of the film against the laser beam considerably.

Next, an example of the laser oscillator appropriate to anneal the a-Si film is shown. It is preferable to employ, for example, XeCl excimer laser L4308 (wavelength 308 nm, pulse width 30 ns) manufactured by Lambda Physik, Inc. because sufficient output and throughput can be obtained. The laser oscillator generates a pulsed laser beam and is able to output energy of 670 mJ per a pulse. The laser beam has a spot size of 10 mm×30 mm (both are width at half maximum) at the laser beam window (exit). The laser beam window (exit) is defined as a plane perpendicular to the traveling direction of the laser beam just after the laser beam is emitted.

The laser beam emitted from the excimer laser usually has a rectangular shape, and when it is expressed with an aspect ratio, the rectangular beam is in the range of 1 to 5 approximately. The laser beam has Gaussian distribution in which the intensity of the laser beam is higher toward the center thereof. The beam spot of the laser beam is changed into a linear beam spot having homogeneous energy distribution and having a size of 125 mm×0.4 mm.

According to the experiment of the present inventor, when the laser beam is irradiated to the semiconductor film, about $\frac{1}{10}$ of the minor width (width at half maximum) of the linear beam spot was the most appropriate pitch for overlapping the laser beam. This improved the homogeneity of the crystallinity in the semiconductor film. In the example, since the minor width was 0.4 mm, the laser beam was irradiated under the condition of the excimer laser in which the pulse frequency was 30 Hz, and the scanning speed was 1.0 mm/s. On this occasion, the energy density of the laser beam on the surface to be irradiated was set to 450 mj/cm$^2$. The method described above is a very general method for crystallizing the semiconductor film with the linear beam spot.

Embodiment 1

FIGS. 4A and 4B show an example of an optical system explained in this embodiment. First, a side view of FIG. 4B is explained. A laser beam emitted from a laser oscillator 151 is propagated to the direction indicated by an arrow in FIGS. 4A and 4B. The laser beam is expanded through spherical lenses 152a and 152b. This structure is not necessary when the beam spot emitted from the laser oscillator 151 is sufficiently large.

A cylindrical lens 155 having a thickness of 20 mm whose second surface has a radius of curvature of −194.25 mm is used to narrow the beam spot in the direction of the minor axis of the rectangular beam. The sign of the radius of curvature is positive when the center of the curvature is on the side where the beam is emitted with respect to the lens surface. The sign is negative when the center of the curvature is on the side where the beam is incident with respect to the lens surface. In addition, it is noted that a lens surface where the laser beam is incident is defined as the first surface, and a lens surface where the laser beam is emitted is defined as the second surface. An optical waveguide 156 having a pair of reflection planes 156a and 156b provided oppositely which is disposed in the position 428.8 mm behind the cylindrical lens 155 homogenizes the energy distribution in the direction of its minor axis of the rectangular beam spot on the surface to be irradiated. Thus, a plane having the homogeneous energy distribution in the direction of the minor axis of the rectangular beam is formed on the exit surface of the optical waveguide 156. The optical waveguide 156 has a length of 300 mm in the direction where the laser beam is incident, and has a distance of 0.4 mm between the reflection planes.

A doublet cylindrical lens comprising cylindrical lenses 157a and 157b, which is disposed in the position 400 mm behind the optical waveguide 156 converges the ray emitted from the optical waveguide 156 in the direction of its minor axis of the rectangular beam on a surface to be irradiated 158 which is disposed in the position 416.9 mm behind the doublet cylindrical lens. The doublet cylindrical lens is a lens including two cylindrical lenses. One cylindrical lens constituting the doublet cylindrical lens has the first surface having a radius of curvature of +122.99 mm, the second surface having a radius of curvature of +90.12 mm and has a thickness of 10 mm. The other cylindrical lens has the first surface having a radius of curvature of +142.32 mm, the second surface having a radius of curvature of −165.54 mm and has a thickness of 20 mm. The two cylindrical lenses are disposed to have a distance of 5 mm in between. This makes it possible to project the homogeneous plane formed on the exit surface of the optical waveguide 156 to the surface to be irradiated 158. The optical waveguide 156 and the doublet cylindrical lens 157 homogenize the energy distribution of the rectangular beam spot in the direction of its minor axis, and determine the length thereof in the direction of its minor axis.

Next, a top view of FIG. 4A is explained. The laser beam emitted from the laser oscillator 151 is divided in the direction of the major axis of the rectangular beam through a cylindrical lens array 153. The cylindrical lens array 153 has five cylindrical lenses, each of which has the first surface having a radius of curvature of +24.5 mm, a thickness of 5 mm and a width of 6.5 mm, arranged in the direction of its curvature.

The laser beams divided by the cylindrical lens array 153 are overlapped on the surface to be irradiated 158 through a cylindrical lens 154 disposed in the position 500 mm behind the cylindrical lens array 153. This homogenizes the energy distribution of the rectangular beam spot in the direction of its major axis. The cylindrical lens 154 is not used in the embodiment mode. This lens makes it possible to decrease the region where the energy is attenuated in opposite ends of the rectangular beam spot in the direction of its major axis. In the apparatus having such a structure, however, the present lens might have an extremely long focal length. In such a case, since the present lens gives little advantageous effect, it is unnecessary to employ this lens.

The laser beam emitted from the cylindrical lens 154 is incident into the optical waveguide 156 which is disposed in the position 1900.8 mm behind the cylindrical lens 154. The optical waveguide 156 has a pair of reflection planes 156a and 156b provided oppositely, each of which has a posterior surface curved to have a radius of curvature of +3751.5 mm. This makes it possible to provide a difference of the incident position in the center and in the opposite ends of the rectangular beam in a direction of its major axis. Therefore, it is possible to make both of the center and the opposite ends in a direction of the major axis of the rectangular beam focused on the surface to be irradiated, and thereby it is also possible to form a rectangular beam spot having homogeneous energy distribution and having a size of 300 mm×0.4 mm.

The optical system shown in this embodiment is used to perform laser annealing to the semiconductor film according to the method shown in the embodiment mode, for example. The semiconductor film can be employed to manufacture an active matrix display or a light-emitting device. These devices may be manufactured by a practitioner with the known method.

Embodiment 2

This embodiment exemplifies another optical system which is different from the optical system described in the embodiment mode. FIGS. 5A and 5B show the example of the optical system explained in this embodiment.

In FIGS. 5A and 5B, the laser beam goes through the same optical path as that shown in FIGS. 3A and 3B except for an optical waveguide 165. The optical waveguide 165 has a pair of reflection planes provided oppositely as well as the optical waveguide 135. The optical waveguide 135 has a hollow space between the pair of reflection planes. On the other hand, the optical waveguide 165 has the space filled with the medium 165c having a refractive index of "n". This is the different point between the two optical waveguides. In the case that the medium 165c has higher refractive index than the material of the reflection planes 165a and 165b, when the laser beam is incident into the optical waveguide 165 at an angle not more than the critical angle, the laser beam is all reflected on the reflection plane. That is to say, the transmittance of the laser beam in the optical waveguide is higher compared with the case in which the laser beam is not all reflected. Therefore, the laser beam from a light source 161 can be converged on a surface to be irradiated 167 more effectively.

The optical system shown in FIGS. 5A and 5B can form the rectangular beam spot having homogeneous energy distribution and having a size of 0.4 mm in its minor axis and 300 mm in its major axis. It is preferable to use the medium such as BSC7 manufactured by HOYA Corp., which has a refractive index of 1.52 against the ultraviolet light and has high transmittance.

The optical system shown in this embodiment is used to perform the laser annealing to the semiconductor film according to the method shown in the embodiment mode. The semiconductor film can be employed to manufacture an active matrix liquid crystal display and an organic EL display using an organic EL element as its light-emitting element. A practitioner may manufacture these devices with the known method.

Embodiment 3

In this embodiment, a process up to manufacture a semiconductor device with the crystalline semiconductor film by using the laser irradiation apparatus of the present invention is described with FIG. 8A-8D and FIG. 9A-9D.

First of all, base films 1101a and 1101b are formed on the substrate 1100. As the substrate 1100, an insulating substrate such as a glass substrate, a quartz substrate, or a crystalline glass substrate, or a ceramic substrate, a stainless substrate, a metal substrate (tantalum, tungsten, molybdenum, and the like), a semiconductor substrate, a plastic substrate (polyimide, acrylic, polyethylene terephthalate, polycarbonate, polyarylate, polyether sulfon and the like) can be used. It is noted that the substrate shall be made from the material that can resist the heat generated through the processes. A glass substrate is used in this embodiment.

As the base films 1101a and 1101b, a silicon oxide film, a silicon nitride film or a silicon oxynitride film can be used and these insulating films may be formed in a single-layer structure or laminated-layer structure of two or more layers. These films are formed by the known method such as a sputtering method, a low-pressure CVD method, or a plasma CVD method. The films are laminated as a laminated-layer structure of two layers in this embodiment but a single-layer structure or a laminated-layer structure of three or more layers does not lead to any problems. In this embodiment, the silicon nitride oxide film is formed 50 nm in thickness as a first layer of the insulating film 1001a, and the silicon oxynitride film is formed 100 nm in thickness as a second layer of the insulating film 1001b. It is noted that the difference between the silicon nitride oxide film and the silicon oxynitride film is defined that the ratio of nitrogen and oxygen contained in those films is different, and the silicon nitride oxide film contains more nitrogen than oxygen.

Figure 8A:
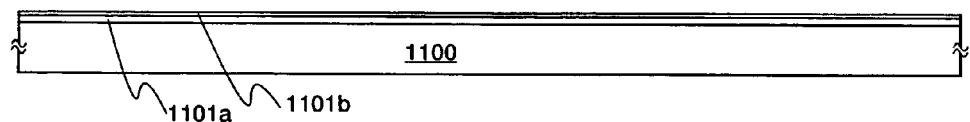
FIGS. 8A to 8D are drawings to show a method of manufacturing a semiconductor device disclosed in the invention.

Next, an amorphous semiconductor film is formed. The amorphous semiconductor film may consist of silicon or the silicon based material ($Si_xGe_{1-x}$ and the like, for example) from 25 nm to 80 nm in thickness. As for its forming means, the known method such as the sputtering method, the low-pressure method, or the plasma CVD method can be employed. In this embodiment, the amorphous silicon film is formed 66 nm in thickness (FIG. 8A).

Figure 8B:
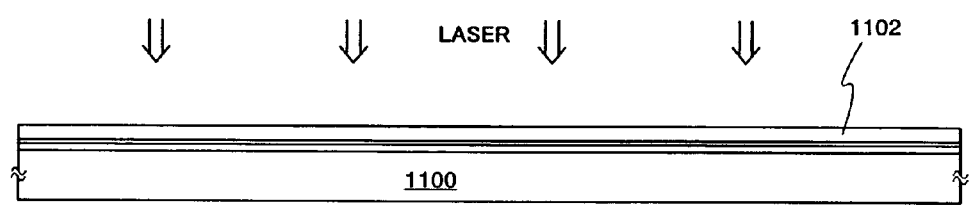

Then the crystallization of the amorphous silicon is performed. In this embodiment, a process to perform laser annealing is explained as the method for crystallization (FIG. 8B).

The laser irradiation apparatus of the present invention is used to perform the laser annealing. The laser oscillator is selected from the group consisting of an excimer laser, a YAG laser, a glass laser, a $YVO_4$ laser, a YLF laser, and an Ar laser.

The laser annealing is performed to crystallize the amorphous silicon by the laser irradiation apparatus of the present invention. More concretely, the laser annealing is performed by the method as described in the embodiment 1 and 2.

In addition, when the semiconductor film after crystallized is used as an active layer of TFT, it is preferable that the scanning direction of the laser light is set to be parallel to the shifting direction of the carrier in the channel forming region.

Figure 8C:
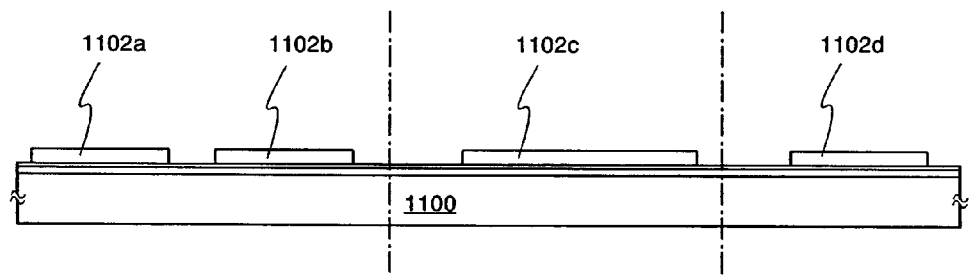
Figure 8D:
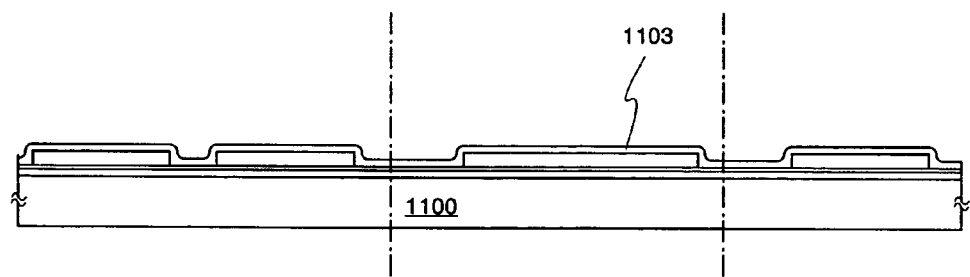

Next, the crystalline semiconductor film 1102 is converted into the desired shape 1102a through 1102d by etching (FIG. 8C). Then a gate insulating film 1103 is formed (FIG. 8D). The film thickness is set to be about 115 nm, and the insulating film including silicon may be formed by the low-pressure CVD method, the plasma CVD method, the sputtering method or the like. In this embodiment, a silicon oxide film is formed. In this case, it is formed by the plasma CVD method with a mixture of TEOS (Tetraethyl Orthosilicate) and $O_2$ at a reaction pressure of 40 Pa, with the substrate temperature set between 300° C. and 400° C., and by discharging at a high frequency (13.56 MHz) electric power density from 0.5 W/cm² to 0.8 W/cm_2. The silicon oxide film which is thus formed gives good characteristics as a gate insulating film by subsequently performing heating process at between 400° C. and 500° C.

By crystallizing the semiconductor film using the laser irradiation apparatus of the present invention, the crystalline semiconductor with good and uniform characteristics can be obtained.

Next, tantalum nitride (TaN) is formed 30 nm in thickness as a first conductive layer on the gate insulating film, and tungsten (W) is formed 370 nm in thickness as a second conductive layer on the first conductive layer. Both the TaN film and the W film may be formed by the sputtering method, and the TaN film is formed by the sputtering using a target of Ta in a nitrogen atmosphere. Further, the W film is formed by sputtering using a target of W. It is necessary to make the film become low resistant in order to use it as a gate electrode, and it is preferable that the resistivity of the W film is made not more than 20 μΩcm. For this reason, it is preferable that the target for the W film is high-purity (99.9999%) and full attention must be paid so that the impurity element is not mixed when the film is formed. The resistivity of the W film thus formed can be made from 9 μΩcm to 20 μΩcm.

It is noted that although in this embodiment the first conductive layer consists of TaN having a thickness of 30 nm, and the second conductive layer consists of W having a thickness of 370 nm, there is no particular limitation for the material of the conductive layers. Both the first conductive layer and the second conductive layer may be formed of the elements selected from the group consisting of Ta, W, Ti, Mo, Al, Cu, Cr, and Nd, or of an alloy material or a chemical compound having one of these elements as its main constituent. Further, a semiconductor film, typically a polycrystalline silicon film in which an impurity element such as phosphorus is doped may be also used, as may an AgPdCu alloy. Moreover, the combination of these can be applied appropriately. The first conductive layer may be formed from 20 nm to 100 nm in thickness. On the other hand, the second conductive layer may be formed from 100 nm to 400 nm in thickness. In addition, a laminated-layer structure of two layers is employed in this embodiment, but a single-layer structure or a laminated-layer structure of three or more layers can be also employed.

Next, a mask made from resist is formed through an exposure process by a photolithography method in order to form electrodes and wirings by etching the conductive layers. The first etching process is performed in accordance with first and second etching conditions. The etching process is performed by using the mask made from resist, and the gate electrodes and the wirings are thus formed. The etching conditions are selected appropriately.

An ICP (Inductively Coupled Plasma) etching method is employed in this embodiment. The etching process is performed under the first etching condition in which a mixed gas of $CF_4$, $Cl_2$ and $O_2$ is used as an etching gas with the gas flow rate 25:25:10 (sccm) respectively, and plasma is generated by applying 500 W RF (13.56 MHz) electric power to a coil shaped electrode at a pressure of 1.0 Pa. 150 W RF (13.56 MHz) electric power is also applied to the substrate side (sample stage), and thereby substantially a negative self-bias voltage is impressed. The W film is etched under the first etching condition, and the edge portions of the first conductive film are made into a tapered shape. In the first etching condition, the etching speed to the W film is 200.39 nm/min. On the other hand, the etching speed to the TaN film is 80.32 nm/min and the selected ratio of the W film to the TaN film is about 2.5. And the angle of the tapered portions in the W film becomes 26° according to the first etching condition.

Next the etching process is performed under the second etching condition without removing the mask made from resist. In the second etching condition, a mixed gas of $CF_4$ and $Cl_2$ is used as an etching gas with the gas flow rate 30:30 (sccm) and plasma is generated by applying 500 W RF (13.56 MHz) to a coil shaped electrode at a pressure of 1.0 Pa. The etching process is performed for about 15 seconds. 20 W RF (13.56 MHz) electric power is also applied to the substrate side (sample stage), and thereby substantially a negative self-bias voltage is impressed. Under the second etching condition using the mixed gas of $CF_4$ and $Cl_2$, the W film and the TaN film are both etched to the same extent. In the second etching condition, the etching speed to the W film is 58.97 nm/min, while the etching speed to the TaN film is 66.43 nm/min. It is noted that in order to perform the etching process without leaving a residue on the gate insulating film, the time for etching is increased by 10% to 20%. Through the first etching process, the gate insulating film which is not covered by the electrode is etched by about 20 nm to 50 nm.

In the first etching process described above, the end portions of the first and second conductive layers are made into tapered shapes due to the bias voltage impressed to the substrate side.

Figure 9A:
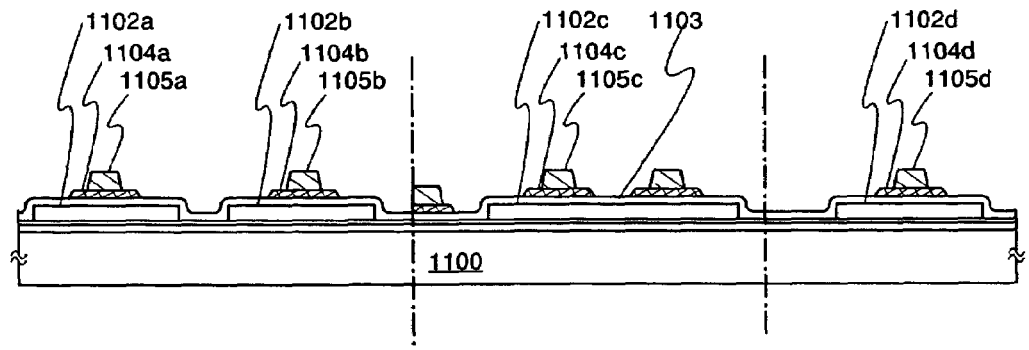
FIGS. 9A to 9D are drawings to show a method of manufacturing a semiconductor device disclosed in the present invention.

Next a second etching process is performed without removing the mask made from resist. The second etching process is performed under the condition in which a mixed gas of $SF_6$, $Cl_2$ and $O_2$ is used as an etching gas with the gas flow rate 24:12:24 (sccm) respectively, and plasma is generated by applying 700 W RF (13.56 MHz) electric power to a coil shaped electrode at a pressure of 1.3 Pa. The etching process is performed for approximately 25 seconds. 10 W RF (13.56 MHz) electric power is also applied to the substrate side (sample stage), and thereby substantially a negative self-bias voltage is impressed. The W film is selectively etched under this etching condition, and the second shaped conductive layer is formed. The first conductive layer is hardly etched in this process. Through the first and second etching processes, the gate electrode consisting of the first conductive layer 1104a to 1104d and the second conductive layer 1105a to 1105d are formed (FIG. 9A).

Then a first doping process is performed without removing the mask made from resist. The impurity element which imparts n-type is doped in the crystalline semiconductor layer at a low concentration through this process. The first doping process may be performed by ion doping method or ion implantation method. Ion doping process is performed under the condition in which the dosage is set from $1\times10^{13}$ atoms/cm$^2$ to $5\times10^{14}$ atoms/cm$^2$, and the acceleration voltage is set from 40 kV to 80 kV. In this embodiment, the acceleration voltage is set to 50 kV. An element belonging to the 15th elements in the periodic table, typically phosphorus (P) or arsenic (As) is used as an impurity element which imparts n-type. Phosphorus (P) is used in this embodiment. Then a first impurity region (N$^-$ region) doped low concentrated impurity is formed in a self-aligning manner by using the first conductive layer as the mask.

Next, the mask made from resist is removed. Then the mask made from resist is newly formed, and a second doping process is performed at the higher acceleration voltage than that in the first doping process. The impurity which imparts n-type is doped also through the second doping process. Ion doping is performed under the conditions in which the dosage is set from $1\times10^{13}$ atoms/cm$^2$ to $3\times10^{14}$ atoms/cm$^2$, and the acceleration voltage is set between 60 kV and 120 kV. In this embodiment, the dosage is set to $3\times10^{15}$ atoms/cm$^2$ and the acceleration voltage is set to 65 kV. The second conductive layer is used as a mask against the impurity element through the second doping process and the doping process is performed so that the impurity element is doped also in the semiconductor layer provided below the first conductive layer.

After performing the second doping process, the second impurity region (N$^-$ region, Lov region) is formed on the portion which is not overlapped with the second conductive layer or which is not covered by the mask among the portions which is overlapped with the first conductive layer in the crystalline semiconductor layer. The impurity which imparts n-type is doped to the second impurity region at the concentration in a range of $1\times10^{18}$ atoms/cm$^3$ to $5\times10^{19}$ atoms/cm$^3$. In addition, the impurity which imparts n-type is doped to the portions which are exposed without being covered by both the first shaped conductive layer and the mask (a third impurity region: N$^+$ region) at the high concentration in a range of $1\times10^{19}$ atoms/cm$^3$ to $5\times10^{21}$ atoms/cm$^3$. It is noted that N$^+$ region exists in the semiconductor layer but there is a portion which is covered by only the mask. Since the concentration of the impurity which imparts n-type in this portion stays the same as that when doped in the first doping process, it can be still called the first impurity region (N$^-$ region).

The impurity regions are formed by performing the doping process twice in this embodiment, but the number of times for performing it is not limited and depends on the conditions. The conditions are appropriately set so as to form the impurity region at the desired concentration by performing the doping process once or plural times.

Then after removing the mask made from resist, the mask made from resist is newly formed and a third doping process is performed. Through the third doping process, a fourth impurity region (P$^+$ region) and a fifth impurity region (P$^-$ region) which are doped impurity element that imparts the opposite conductivity type of the first and second conductivity type are formed in the semiconductor layer which becomes P-channel type TFTs.

Through the third doping process, the fourth impurity region (P$^+$ region) is formed on the portion which is not covered by the mask made from resist and further is not overlapped with the first conductive layer. And the fifth impurity region (P$^-$ region) is formed on the portion which is not covered by the mask made from resist and which is overlapped with the first conductive layer but not overlapped with the second conductive layer. An element belonging to the 13th elements in the periodic table, typically boric acid (B), aluminum (Al), gallium (Ga) or the like is known as the impurity which imparts p-type. In this embodiment, the fourth impurity region and the fifth impurity region are formed by the ion doping method using diborane ($B_2H_6$) by selecting boric acid (B) as the impurity which imparts p-type. As the conditions of the ion doping method, the dosage is set to $1\times10^{16}$ atoms/cm$^2$ and the acceleration voltage is set to 80 kV.

It is noted that the semiconductor layer to form the N-channel TFT is covered by the mask made from resist through the third doping process.

Through the first and the second doping processes, phosphorus (P) is doped in the fourth impurity region (P$^+$ region) and the fifth impurity region (P$^-$ region) at the different concentration respectively. However, in both the fourth impurity region (P$^+$ region) and the fifth impurity region (P$^-$ region), the third doping process is performed so that the impurity element which imparts p-type is doped at the concentration in a range of $1\times10^{19}$ atoms/cm$^2$ to $5\times10^{21}$ atoms/cm$^2$. Therefore, the fourth impurity region (P$^+$ region) and the fifth impurity region (P$^-$ region) work as the source region or the drain region without any problems.

It is noted that in this embodiment, the fourth impurity region (P$^+$ region) and the fifth impurity region (P$^-$ region) are formed by performing the third doping process once, but the number of times to perform it is not limited to this. The doping process may be performed plural times appropriately depending on its conditions to form the fourth impurity region (P$^+$ region) and the fifth impurity region (P$^-$ region).

Figure 9B:
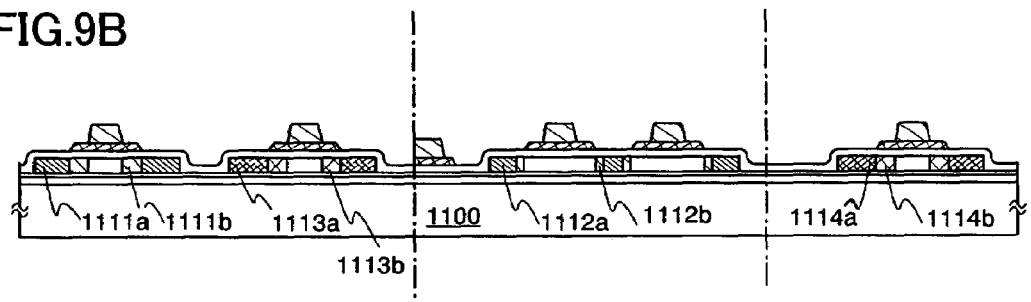

By performing these doping processes, the first impurity region (N$^-$ region) 1112b, the second impurity region (N$^-$ region, Lov region) 1111b, the third impurity region (N$^+$ region) 1111a, 1112a, the fourth impurity region (P$^+$ region) 1113a, 1114a, and the fifth impurity region (P$^-$ region) 1113b, 1114b are formed (FIG. 9B).

Next, after removing the mask made from resist, a first passivation film 1120 is formed. The insulating film including silicon is formed from 100 nm to 200 nm in thickness as the first passivation film 1120. The plasma CVD method or the sputtering method can be employed as its forming method. In this embodiment, a silicon oxynitride film is formed 100 nm in thickness by the plasma CVD method. In the case to use the silicon oxynitride film, the silicon oxynitride film consisting of $SiH_4$ $_{and\ N_2}O$ and $NH_3$ or the silicon oxynitride film consisting of $SiH_4$ and $N_2O$ may be formed by the plasma CVD method. In this case, these films are formed under the conditions at a reaction pressure from 20 Pa to 200 Pa, with the substrate temperature set between 300° C. and 400° C., and by discharging at a high frequency (60 MHz) electric power density from 0.1 $W/cm^2$ to 1.0 $W/cm^2$. In addition, the silicon oxynitride hydride film consisting of $SiH_4$, $N_2O$ and $H_2$ may be applied as the first passivation film 1120. Of course, the first passivation film 1120 is not limited to the single-layer structure of the silicon oxynitride film as shown in this embodiment. The insulating film including silicon may be used for a single-layer structure or the laminated-layer structure as the first passivation film 1120.

After that, a heating process is performed to recover the crystallinity of the semiconductor layer and activate the impurity elements doped in the semiconductor layer. It is noted that, in addition to the heating process, laser annealing method, or rapid thermal annealing method (RTA method) can be also applied.

Furthermore, by performing the heating process after forming the first passivation film 1120, hydrogenation of the semiconductor film can be performed at the same time of activating process. Hydrogenation is performed in order to terminate the dangling bond of the semiconductor layer by hydrogen included in the first passivation film 1120.

Moreover, the heating process may be performed before forming the first passivation film 1120. However, it is noted that in the case that the materials used in the first conductive layer 1104a to 1104d and the second conductive layer 1105a to 1105d are of low-resistance against heat, it is preferable that the heating process is performed after forming the first passivation film 1120 in order to protect the wirings and the like as shown in this embodiment. Further, in this case, hydrogenation by applying the hydrogen contained in the passivation film 1120 cannot be performed because there is not the first passivation film 1120.

In this case, hydrogenation by applying hydrogen excited by plasma (plasma hydrogenation), or hydrogenation by the heating process in the atmosphere including the hydrogen of 3% to 100% at the temperature between 300° C. and 450° C. for 1 hour to 12 hours may be conducted.

Figure 9C:
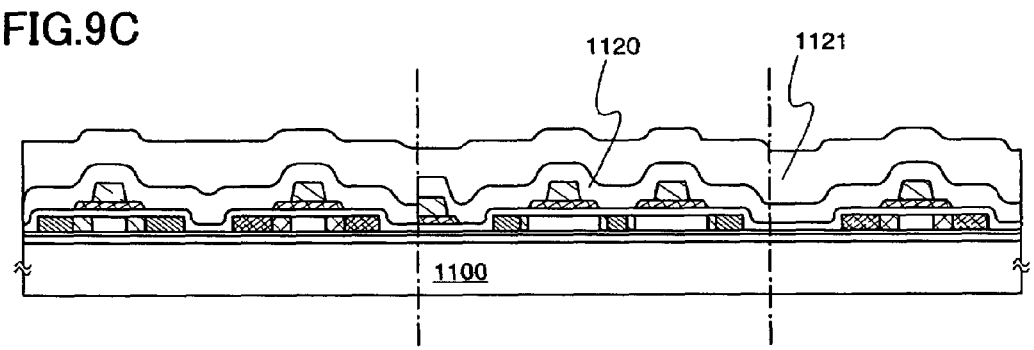
Figure 9D:
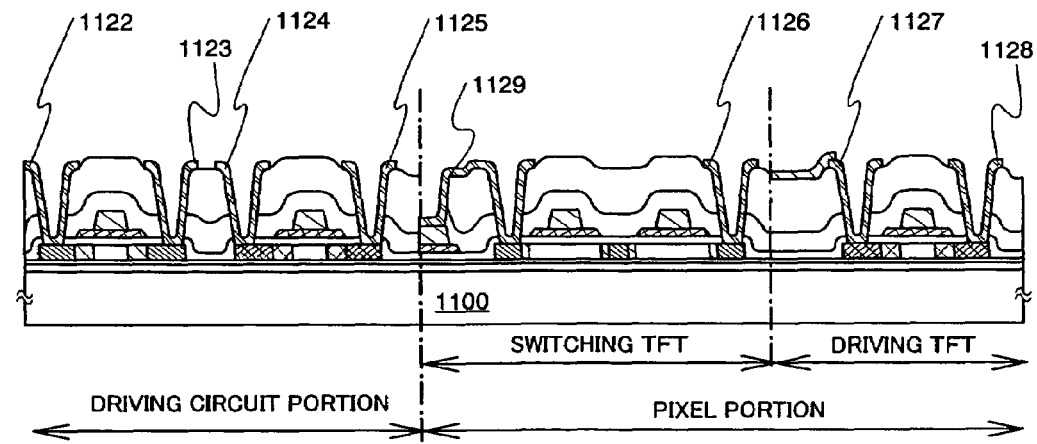

Next, a first interlayer insulating film 1121 is formed on the first passivation film 1120. An inorganic insulating film or an organic insulating film may be used as the first interlayer insulating film 1121 (FIG. 9C). As the inorganic insulating film, the silicon oxide film formed by the CVD method, the silicon oxide film formed by the SOG (Spin On Glass) method or the like may be used. As the organic insulating film, polyimide, polyamide, BCB (benzocyclobutene), acrylic, or positive type photosensitive organic resin, negative type photosensitive organic resin or the like can be used. In addition, the laminated-layer structure of the acrylic film and the silicon oxynitride film may be employed.

Moreover, the interlayer insulating film can be formed of the material including at least hydrogen in the substituent and with the structure in which silicon (Si) and oxygen (O) are bond. Furthermore, the interlayer insulating film can be formed of the material with at least one selecting from the group consisting of fluorine, alkyl group, and aromatic hydrocarbon in the substituent. The representative example is siloxanic polymer.

Siloxanic polymer can be classified into silica-glass, alkyl siloxanic polymer, alkyl silceschioxanic polymer, silceschioxanic polymer hydride, alkyl silceschioxanic polymer hydride and the like by its structure.

In addition, the interlayer insulating film may be formed of the material including the polymer with Si—N bond (polysilazane).

By using the above material, even though the interlayer insulating film is made to be thinner, the interlayer insulating film with sufficient insulating property and evenness can be obtained. Moreover, since the above material shows high-resistance against heat, the interlayer insulating film which can resist through reflowing process in the multilayers wirings. Furthermore, because its hygroscopic property is low, the interlayer insulating film with small dehydration amount can be formed.

In this embodiment, the non-photosensitive acrylic film having a thickness of 1.6 μm is formed. The unevenness by TFT formed on the substrate can be modified and be made even by the first interlayer insulating film. Especially since the first interlayer insulating film is provided mainly for planarization, the insulating film formed of the material which is easily planarized is preferable.

After that, a second passivation film (not shown in the figure) consisting of a silicon nitride oxide film and the like is formed on the first interlayer insulating film from 10 nm to 200 nm in thickness approximately. The second passivation film can suppress the moisture moving in and out of the first interlayer insulating film. The second passivation film may be formed of a silicon nitride film, an aluminum nitride film, an aluminum oxynitride film, a diamond-like carbon (DLC) film, or a carbon nitride (CN) film as well.

In addition, the film formed by the RF sputtering method is extremely precise, and is superior in its barrier property. When forming the silicon oxynitride film for example, the film is formed under the conditions for the RF sputtering where the Si is used as a target, the mixed gas of $N_2$, Ar, and $N_2O$ is set to 31:5:4 at the gas flow rate respectively, the pressure is 0.4 Pa and the electric power is 3000 W. Furthermore, when forming the silicon nitride film, the film is formed under the conditions where the Si is used as a target, the mixed gas of $N_2$ and Ar is set to 20:20 at the gas flow rate respectively, the pressure is 0.8 Pa, the electric power is 3000 W and the temperature in forming film is set to 215° C. In this embodiment, the silicon oxynitride film is formed 70 nm in thickness by the RF sputtering method.

Next, the second passivation film, the first interlayer insulating film and the first passivation film are etched (by performing the etching process) to form a contact hole that reaches the third and the fourth impurity region.

After that, the wirings and the electrodes (1122 to 1129) that connect with each impurity region electrically are formed. It is noted that these wirings are formed by patterning the laminated-layer film consisting of the Ti film having a thickness of 50 nm and the alloy film (Al and Ti) having a thickness of 500 nm. Of course, it is not limited to the laminated-layer structure of two layers, but a single-layer structure or a laminated-layer structure of three or more layers may be applied. Moreover, the material for the wirings is not limited to Al and Ti. For example, the wirings are formed by patterning the laminated-layer film where an Al film or a Cu film is formed on the TaN film, and a Ti film is further formed thereon.

As shown above, when the semiconductor device is manufactured by using the laser irradiation apparatus of the present invention, it shows good and uniform characteristic, and thereby it can be applied to various electrical devices, especially a display device preferably. Moreover, the reliability of such devices can be highly improved.

Further, the present embodiment can be combined with the embodiment mode, comparative example and embodiments 1 to 2, freely.

What is claimed is:

1. A beam homogenizer comprising:
an optical waveguide comprising:
a pair of reflection planes provided oppositely;
a first end surface into which a laser beam is incident; and
a second end surface from which the laser beam is emitted,
wherein at least one edge of the pair of reflection planes at the second end surface has a concave configuration.

2. A beam homogenizer comprising:
an optical waveguide comprising:
a pair of reflection planes provided oppositely;
a first end surface into which a rectangular beam spot is incident; and
a second end surface from which the rectangular beam spot is emitted,
wherein at least one edge of the pair of reflection planes at the second end surface has a concave configuration.

3. A beam homogenizer according to claim 1, wherein the optical waveguide homogenizes energy distribution of the laser beam in a direction of a minor axis thereof.

4. A beam homogenizer according to claim 1, wherein the second end surface is curved so that a center and opposite ends of the laser beam are focused on a surface to be irradiated when the laser beam emitted from the optical waveguide is projected through a cylindrical lens.

5. A beam homogenizer according to claim 2, wherein the second end surface is curved so that a center and opposite ends of the rectangular beam spot are focused on a surface to be irradiated when the rectangular beam spot emitted from the optical waveguide is projected through a cylindrical lens.

6. A beam homogenizer according to claim 2, wherein the optical waveguide homogenizes energy distribution of the rectangular beam spot in a direction of a minor axis thereof.

7. A beam homogenizer according to claim 2, wherein the rectangular beam spot has an aspect ratio not less than 10.

8. A beam homogenizer according to claim 2, wherein the rectangular beam spot has an aspect ratio not less than 100.

9. A beam homogenizer comprising:
a light pipe comprising:
a pair of reflection planes provided oppositely;
a first end surface into which a laser beam is incident; and
a second end surface from which the laser beam is emitted,
wherein at least one edge of the pair of reflection planes at the second end surface has a concave configuration.

10. A beam homogenizer comprising:
a light pipe comprising:
a pair of reflection planes provided oppositely;
a first end surface into which a rectangular beam spot is incident; and
a second end surface from which the rectangular beam spot is emitted,
wherein at least one edge of the pair of reflection planes at the second end surface has a concave configuration.

11. A beam homogenizer according to claim 9, wherein the light pipe homogenizes energy distribution of the laser beam in a direction of a minor axis thereof.

12. A beam homogenizer according to claim 9, wherein the second end surface is curved so that a center and opposite ends of the laser beam are focused on a surface to be irradiated when the laser beam emitted from the light pipe is projected through a cylindrical lens.

13. A beam homogenizer according to claim 10, wherein the second end surface is curved so that a center and opposite ends of the rectangular beam spot are focused on a surface to be irradiated when the rectangular beam spot emitted from the light pipe is projected through a cylindrical lens.

14. A beam homogenizer according to claim 10, wherein the light pipe homogenizes energy distribution of the rectangular beam spot in a direction of a minor axis thereof.

15. A beam homogenizer according to claim 10, wherein the rectangular beam spot has an aspect ratio not less than 10.

16. A beam homogenizer according to claim 10, wherein the rectangular beam spot has an aspect ratio not less than 100.

17. A laser irradiation apparatus comprising:
a laser oscillator;
a beam homogenizer,
wherein the beam homogenizer comprises an optical waveguide having a pair of reflection planes provided oppositely, a first end surface into which a laser beam is incident from the laser oscillator, and a second end surface from which the laser beam is emitted, and
one cylindrical lens or a plurality of cylindrical lenses for projecting the laser beam emitted from the second end surface,
wherein at least one edge of the pair of reflection planes at the second end surface has a concave configuration.

18. A laser irradiation apparatus comprising:
a laser oscillator;
a cylindrical lens array for homogenizing energy distribution of a laser beam emitted from the laser oscillator in a first direction;
a beam homogenizer for homogenizing the energy distribution of the laser beam in a second direction perpendicular to the first direction,
wherein the beam homogenizer comprises an optical waveguide having a pair of reflection planes provided oppositely, a first end surface into which the laser beam is incident from the cylindrical lens array, and a second end surface from which the laser beam is emitted, and
one cylindrical lens or a plurality of cylindrical lenses for projecting the laser beam emitted from the second end surface in the second direction,
wherein at least one edge of the pair of reflection planes at the second end surface has a concave configuration.

19. A laser irradiation apparatus according to claim 17, wherein the second end surface is curved so that a center and opposite ends of the laser beam are focused on a surface to be irradiated when the laser beam emitted from the optical waveguide is projected through the cylindrical lens or the plurality of cylindrical lenses.

20. A laser irradiation apparatus according to claim 18, wherein the second end surface is curved so that a center and opposite ends of the laser beam are focused on a surface to be irradiated when the laser beam emitted from the optical waveguide is projected through the cylindrical lens or the plurality of cylindrical lenses.

21. A laser irradiation apparatus comprising:
a laser oscillator;
a beam homogenizer,
wherein the beam homogenizer comprises a light pipe having a pair of reflection planes provided oppositely, a first end surface into which the laser beam is incident from the laser oscillator, and a second end surface from which the laser beam is emitted, and one cylindrical lens or a plurality of cylindrical lenses for projecting the laser beam emitted from the second end surface, wherein at least one edge of the pair of reflection planes at the second end surface has a concave configuration.

22. A laser irradiation apparatus comprising:

a laser oscillator;

a cylindrical lens array for homogenizing energy distribution of a laser beam emitted from the laser oscillator in a first direction;

a beam homogenizer for homogenizing the energy distribution of the laser beam in a second direction perpendicular to the first direction, wherein the beam homogenizer comprises a light pipe having a pair of reflection planes provided oppositely, a first end surface into which the laser beam is incident from the cylindrical lens array, and a second end surface from which the laser beam is emitted, and one cylindrical lens or a plurality of cylindrical lenses for projecting the laser beam emitted from the second end surface in the second direction, wherein at least one edge of the pair of reflection planes at the second end surface has a concave configuration.

23. A laser irradiation apparatus according to claim 21, wherein the second end surface is curved so that a center and opposite ends of the laser beam are focused on a surface to be irradiated when the laser beam emitted from the light pipe is projected through the cylindrical lens or the plurality of cylindrical lenses.

24. A laser irradiation apparatus according to claim 22, wherein the second end surface is curved so that a center and opposite ends of the laser beam are focused on a surface to be irradiated when the laser beam emitted from the light pipe is projected through the cylindrical lens or the plurality of cylindrical lenses.

25. A laser irradiation apparatus according to claim 17, wherein the laser beam is rectangular in shape.

26. A laser irradiation apparatus according to claim 18, wherein the laser beam is rectangular in shape.

27. A laser irradiation apparatus according to claim 21, wherein the laser beam is rectangular in shape.

28. A laser irradiation apparatus according to claim 22, wherein the laser beam is rectangular in shape.

29. A laser irradiation apparatus according to claim 17, wherein the beam homogenizer homogenizes energy distribution of the laser beam in a direction of a minor axis thereof.

30. A laser irradiation apparatus according to claim 25, wherein the rectangular laser beam has an aspect ratio not less than 10.

31. A laser irradiation apparatus according to claim 26, wherein the rectangular laser beam has an aspect ratio not less than 10.

32. A laser irradiation apparatus according to claim 25, wherein the rectangular laser beam has an aspect ratio not less than 100.

33. A laser irradiation apparatus according to claim 26, wherein the rectangular laser beam has an aspect ratio not less than 100.

34. A laser irradiation apparatus according to claim 17, wherein the laser oscillator is selected from the group consisting of an excimer laser, a YAG laser, a glass laser, a $YVO_4$ laser, a YLF laser, and an Ar laser.

35. A laser irradiation apparatus according to claim 18, wherein the laser oscillator is selected from the group consisting of an excimer laser, a YAG laser, a glass laser, a $YVO_4$ laser, a YLF laser, and an Ar laser.

36. A laser irradiation apparatus according to claim 21, wherein the laser oscillator is selected from the group consisting of an excimer laser, a YAG laser, a glass laser, a $YVO_4$ laser, a YLF laser, and an Ar laser.

37. A laser irradiation apparatus according to claim 22, wherein the laser oscillator is selected from the group consisting of an excimer laser, a YAG laser, a glass laser, a $YVO_4$ laser, a YLF laser, and an Ar laser.

38. A method for manufacturing a semiconductor device comprising:

forming an amorphous semiconductor film over a substrate; and shaping a laser beam oscillated from a laser oscillator through a cylindrical lens array and a beam homogenizer into a rectangular beam spot on the amorphous semiconductor film;

performing a laser annealing to the amorphous semiconductor film while moving the rectangular beam spot, wherein the beam homogenizer comprises an optical waveguide having a pair of reflection planes provided oppositely, a first end surface into which the laser beam is incident from the cylindrical lens array, and a second end surface from which the laser beam is emitted, and wherein at least one edge of the pair of reflection planes at the second end surface has a concave configuration.

39. A method for manufacturing a semiconductor device according to claim 38, wherein the second end surface is curved so that a center and opposite ends of the rectangular beam spot are focused on the amorphous semiconductor film when the laser beam emitted from the optical waveguide is projected through a cylindrical lens.

40. A method for manufacturing a semiconductor device comprising the steps of:

forming an amorphous semiconductor film over a substrate; and shaping a laser beam oscillated from a laser oscillator through a cylindrical lens array and a beam homogenizer into a rectangular beam spot on the amorphous semiconductor film;

performing a laser annealing to the amorphous semiconductor film while moving the rectangular beam spot, wherein the beam homogenizer comprises a light pipe having a pair of reflection planes provided oppositely, a first end surface into which the laser beam is incident from the cylindrical lens array, and a second end surface from which the laser beam is emitted, and wherein at least one edge of the pair of reflection planes at the second end surface has a concave configuration.

41. A method for manufacturing a semiconductor device according to claim 40, wherein the second end surface is curved so that a center and opposite ends of the rectangular beam spot are focused on the amorphous semiconductor film when the laser beam emitted from the light pipe is projected through a cylindrical lens.

42. A method for manufacturing a semiconductor device according to claim 38, wherein the laser oscillator is selected from the group consisting of an excimer laser, a YAG laser, a glass laser, a $YVO_4$ laser, a YLF laser, and an Ar laser.

43. A method for manufacturing a semiconductor device according to claim 40, wherein the laser oscillator is selected from the group consisting of an excimer laser, a YAG laser, a glass laser, a $YVO_4$ laser, a YLF laser, and an Ar laser.

44. A method for manufacturing a semiconductor device according to claim 38, wherein the rectangular beam spot has an aspect ratio not less than 10.

45. A method for manufacturing a semiconductor device according to claim 40, wherein the rectangular beam spot has an aspect ratio not less than 10.

46. A method for manufacturing a semiconductor device according to claim 38, wherein the rectangular beam spot has an aspect ratio not less than 100.

47. A method for manufacturing a semiconductor device according to claim 40, wherein the rectangular beam spot has an aspect ratio not less than 100.

48. A method of manufacturing a semiconductor device comprising:
produce a laser beam wherein the laser beam has a cross section perpendicular to a propagation direction of the laser beam, the cross section having a width and a length;

expanding the laser beam to extend the cross section of the laser beam along a lengthwise direction of the cross section;

homogenizing the expanded laser beam along a widthwise direction of the cross section by using a beam homogenizer, the beam homogenizer including a pair of plates having reflective inner surfaces opposed to each other with a gap therebetween through which the expanded laser beam propagates; and projecting the homogenized laser beam to a semiconductor film, wherein each edge of the pair of plates has a concave configuration where each edge is directed to the semiconductor film.

49. A method for manufacturing a semiconductor device according to claim 48, wherein the laser beam is a pulsed laser beam.

50. A method for manufacturing a semiconductor device according to claim 48, wherein the laser beam is expanded by at least one selected from the group consisting of a spherical lens, a cylindrical lens array and a cylindrical lens.

51. A method for manufacturing a semiconductor device according to claim 48, wherein the laser beam is projected by a doublet cylindrical lens.

52. A method for manufacturing a semiconductor device according to claim 48, wherein the laser beam is projected to the semiconductor film for crystallizing the semiconductor film.

53. A method for manufacturing a semiconductor device according to claim 48, further comprising a step of condensing the homogenized laser beam along the widthwise direction before irradiating the semiconductor film.

* * * * *